US012641923B2

(12) United States Patent
Park et al.

(10) Patent No.: US 12,641,923 B2
(45) Date of Patent: May 26, 2026

(54) DISPLAY DEVICE AND METHOD OF MANUFACTURING THE SAME

(71) Applicant: Samsung Display Co., LTD., Yongin-si (KR)

(72) Inventors: Jun Hong Park, Yongin-si (KR); Bo Geon Jeon, Yongin-si (KR); Eui Suk Jung, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 796 days.

(21) Appl. No.: 17/872,303

(22) Filed: Jul. 25, 2022

(65) Prior Publication Data

US 2023/0170438 A1      Jun. 1, 2023

(30) Foreign Application Priority Data

Dec. 1, 2021      (KR) ......................... 10-2021-0170165

(51) Int. Cl.
*H10H 20/819*          (2025.01)
*H01L 23/00*          (2006.01)
(Continued)

(52) U.S. Cl.
CPC ........... *H10H 20/819* (2025.01); *H01L 24/95* (2013.01); *H01L 25/167* (2013.01); *H10H 20/01335* (2025.01); *H10H 20/0137* (2025.01); *H10H 20/018* (2025.01); *H01L 24/05* (2013.01); *H01L 24/08* (2013.01); *H01L 24/24* (2013.01); *H01L 2224/05082* (2013.01); *H01L 2224/05139* (2013.01); *H01L 2224/05186* (2013.01); *H01L 2224/05572* (2013.01); *H01L*

*2224/05573* (2013.01); *H01L 2224/05686* (2013.01); *H01L 2224/0569* (2013.01); *H01L 2224/08145* (2013.01); *H01L 2224/08503* (2013.01); *H01L 2224/24051* (2013.01); *H01L 2224/24137* (2013.01); *H01L 2224/80006* (2013.01); *H01L 2224/80224* (2013.01);
(Continued)

(58) Field of Classification Search
CPC ........................... H10H 20/819; H10H 29/142
See application file for complete search history.

(56) References Cited

U.S. PATENT DOCUMENTS

| | | | | |
|---|---|---|---|---|
| 2013/0027623 A1* | 1/2013 | Negishi | ..................... | F21K 9/00 |
| | | | | 438/30 |
| 2021/0288217 A1* | 9/2021 | Li | ........................... | H10H 20/84 |

(Continued)

FOREIGN PATENT DOCUMENTS

| | | | | |
|---|---|---|---|---|
| KR | 10-2039838 | 11/2019 | | |
| WO | WO-2019168187 A1 * | 9/2019 | ............. | C30B 29/46 |
| WO | WO-2020218722 A1 * | 10/2020 | ............. | H01L 24/32 |

*Primary Examiner* — Michele Fan

(74) *Attorney, Agent, or Firm* — CANTOR COLBURN LLP

(57) ABSTRACT

A display device includes a pixel circuit layer disposed on a substrate, a first electrode disposed on the pixel circuit layer, light emitting elements provided on the first electrode and electrically connected to the first electrode, a second electrode provided on the light emitting elements, and an insulating layer filling gaps between the light emitting elements between the first electrode and the second electrode. Each of the light emitting elements includes a first end and a second end, and the first end includes a curved surface.

22 Claims, 14 Drawing Sheets

(51) Int. Cl.
| | | |
|---|---|---|
| *H01L 25/16* | (2023.01) | |
| *H10H 20/01* | (2025.01) | |
| *H10H 20/825* | (2025.01) | |
| *H10H 20/833* | (2025.01) | |

(52) U.S. Cl.
CPC ................. *H01L 2224/8081* (2013.01); *H01L 2224/95001* (2013.01); *H01L 2924/0549* (2013.01); *H01L 2924/10157* (2013.01); *H01L 2924/12041* (2013.01); *H10H 20/032* (2025.01); *H10H 20/0362* (2025.01); *H10H 20/8252* (2025.01); *H10H 20/833* (2025.01)

(56) References Cited

U.S. PATENT DOCUMENTS

2022/0209070 A1\* 6/2022 Lim ....................... H01L 25/167
2022/0310884 A1\* 9/2022 Do .......................... H01L 24/80

\* cited by examiner

DISPLAY DEVICE AND METHOD OF MANUFACTURING THE SAME

CROSS-REFERENCE TO RELATED APPLICATION(S)

The application claims priority to and the benefit of Korean Patent Application No. 10-2021-0170165 under 35 U.S.C. § 119, filed in the Korean Intellectual Property Office (KIPO) on Dec. 1, 2021, the entire contents of which are incorporated herein by reference.

BACKGROUND

1. Technical Field

The invention relates to a display device and a method of manufacturing the same.

2. Description of Related Art

In recent years, as interest in information display increases, research and development on display devices are continuously being made.

SUMMARY

One of the objects of the disclosure is for example to provide a display device including at least one light emitting element having a curved surface at a first end connected to a first electrode.

Another object of the disclosure is to provide a method of manufacturing the display device.

However, objects of the disclosure are not limited to the above-described objects, and may be variously extended without departing from the spirit and scope of the disclosure.

In order to achieve the object of the disclosure, a display device according to embodiments of the disclosure may include a pixel circuit layer disposed on a substrate; a first electrode disposed on the pixel circuit layer; light emitting elements provided on the first electrode and electrically connected to the first electrode; a second electrode provided on the light emitting elements; and an insulating layer filling gaps between the light emitting elements between the first electrode and the second electrode. Each of the light emitting elements may include a first end and a second end, and the first end may include a curved surface.

In an embodiment, the first end may correspond to a lower end of a corresponding one of the light emitting elements, and the second end may correspond to an upper end of the corresponding one of the light emitting elements.

In an embodiment, the first end of each of the light emitting elements may include the curved surface in a form of a round convex toward an outside.

In an embodiment, the first end of each of the light emitting elements may further include a flat portion extending from the curved surface.

In an embodiment, at least part of the light emitting elements may be disposed to be inclined with respect to a vertical direction.

In an embodiment, the second end of each of the at least part of the light emitting elements inclined with respect to the vertical direction may have an inclined surface with respect to the substrate.

In an embodiment, the first end of each of the light emitting elements may directly contact the first electrode.

In an embodiment, each of the light emitting elements may include a first semiconductor layer electrically connected to the second electrode; a second semiconductor layer electrically contacting the first electrode; and an active layer disposed between the first semiconductor layer and the second semiconductor layer.

In an embodiment, the second semiconductor layer may include the curved surface corresponding to the first end.

In an embodiment, each of the light emitting elements may further include an insulating film surrounding an outer surface of each of the first semiconductor layer, the active layer, and the second semiconductor layer; and a reflective member surrounding an outer surface of the insulating film.

In an embodiment, the reflective member may partially surround the outer surface of the insulating film so that a portion of the insulating film is exposed to the outside.

In an embodiment, the display device may further include a light control layer provided on the second electrode and controlling a wavelength of light emitted from the light emitting elements; and a thin film encapsulation layer provided on the light control layer.

In order to achieve the object of the disclosure, a method of manufacturing a display device according to embodiments of the disclosure may include forming grooves on a base substrate; depositing a light emitting element layer on the base substrate; removing remaining portions of the light emitting element layer except for portions overlapping the grooves in a plan view to form light emitting elements; attaching a transfer film to upper surfaces of the light emitting elements; removing the base substrate to expose a first end of each of the light emitting elements; bonding the first end of each of the light emitting elements to a first electrode formed on a pixel circuit layer; separating the transfer film from the light emitting elements; forming an insulating layer on the first electrode to fill gaps between the light emitting elements; and forming a second electrode on the light emitting elements and the insulating layer. The first end of each of the light emitting elements may include a curved surface.

In an embodiment, the curved surface of the first end may correspond to a shape of each of the grooves.

In an embodiment, the forming of the grooves on the base substrate may include forming an organic film on the base substrate; and patterning the organic film to form the grooves to expose at least a portion of the base substrate.

In an embodiment, the bonding of the first end of each of the light emitting elements to the first electrode may include stretching the transfer film; and bonding the first end of each of the light emitting elements with deformed gaps to the first electrode.

In an embodiment, the first end may correspond to a lower end of a corresponding one of the light emitting elements, and a second end may correspond to an upper end of the corresponding one of the light emitting elements.

In an embodiment, the first end of each of the light emitting elements may include the curved surface in a form of a round convex toward an outside.

In an embodiment, at least part of the light emitting elements may be disposed to be inclined with respect to a vertical direction.

In an embodiment, the second end of each of the at least part of the light emitting elements inclined with respect to the vertical direction may have an inclined surface with respect to a substrate of the display device.

In order to achieve the object of the disclosure, a display device according to embodiments of the disclosure may include a pixel circuit layer disposed on a substrate; a first electrode disposed on the pixel circuit layer; a light emitting element provided on the first electrode and electrically connected to the first electrode; a second electrode provided on the light emitting element; and an insulating layer contacting a side surface of the light emitting element between the first electrode and the second electrode. The light emitting element may include a first end and a second end in a longitudinal direction, and the first end opposite to the first electrode may include a curved surface.

In an embodiment, the first end of the light emitting element may include the curved surface in a form of a round convex toward an outside, and the light emitting element may be disposed to be inclined with respect to a vertical direction so that the second end has a shape inclined with respect to a horizontal direction.

In order to achieve the object of the disclosure, a light emitting element according to embodiments of the disclosure may include a first semiconductor layer; a second semiconductor layer; an active layer interposed between the first semiconductor layer and the second semiconductor layer; an insulating film surrounding an outer surface of each of the first semiconductor layer, the active layer, and the second semiconductor layer; and a reflective member surrounding an outer surface of the insulating film. An exposed end of the second semiconductor layer may include a curved surface in a form of a round convex toward an outside.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
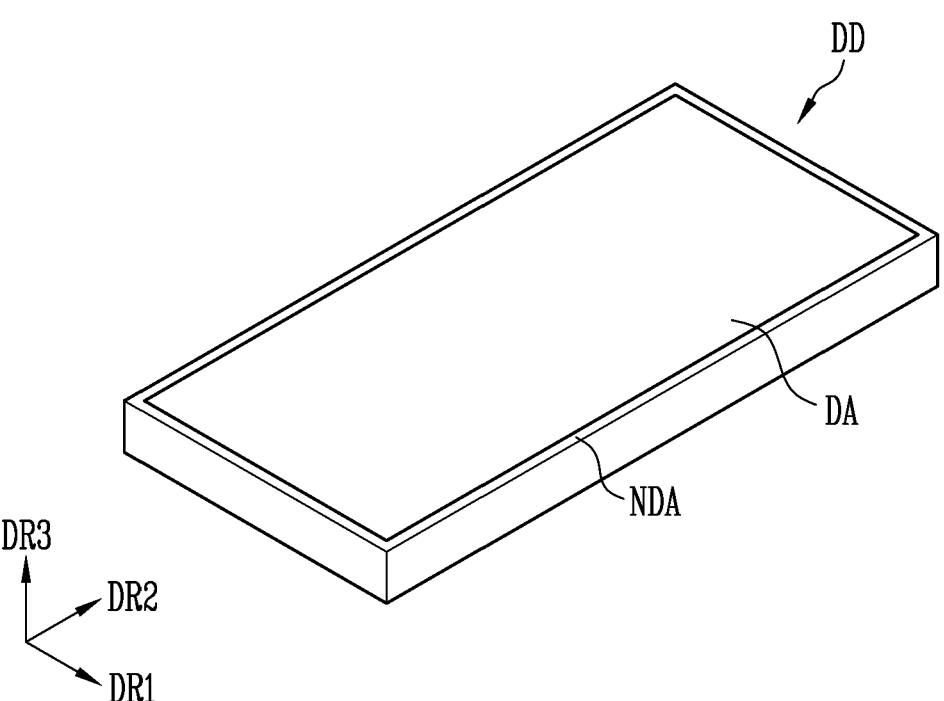
FIG. 1 is a schematic perspective view schematically illustrating a display device according to embodiments of the disclosure.

In the following description, for the purpose of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing exemplary features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements, and repetitive descriptions for the same elements are omitted.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" may encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
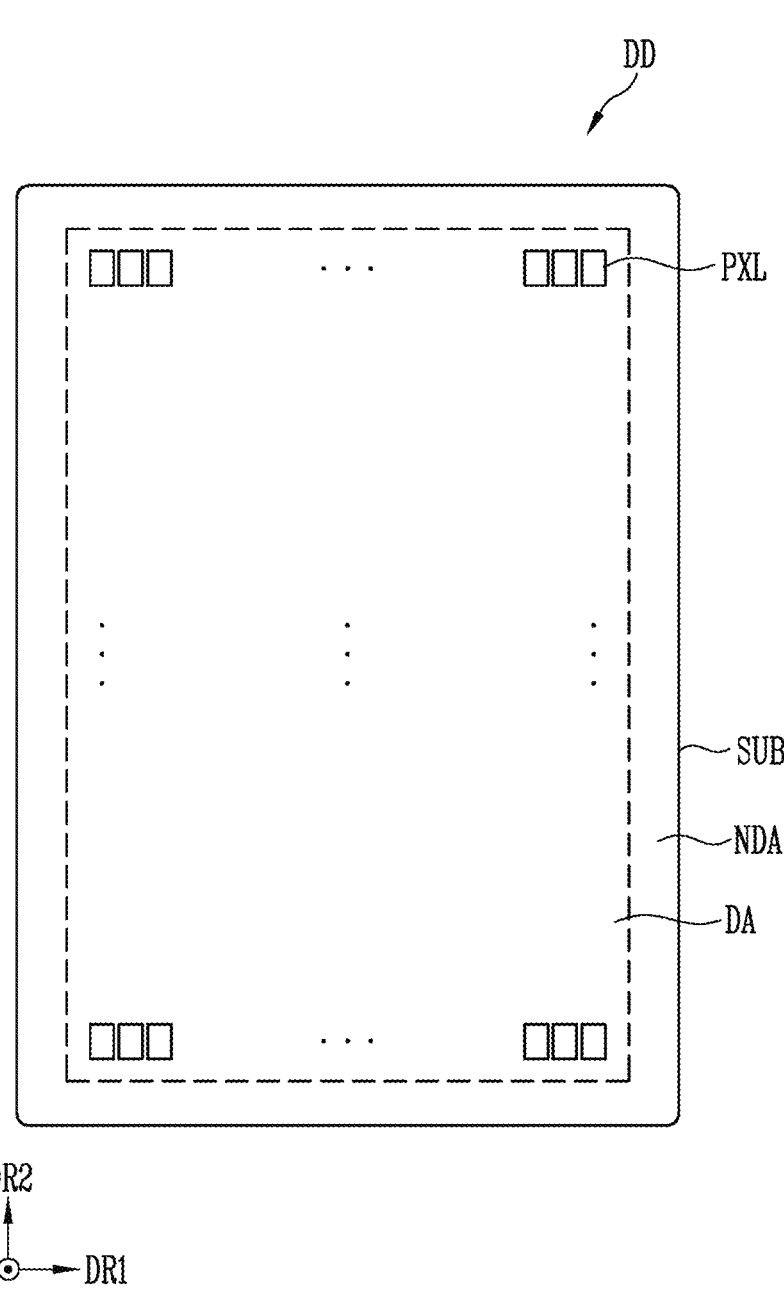
FIG. 2 is a schematic plan view schematically illustrating an example of the display device of FIG. 1.

FIG. 1 is a schematic perspective view schematically illustrating a display device according to embodiments of the disclosure. FIG. 2 is a schematic plan view schematically illustrating an example of the display device of FIG. 1.

Referring to FIGS. 1 and 2, a display device DD may include a display area DA and a non-display area NDA.

In case that the display device DD is an electronic device having a display surface applied to at least one surface, such as a smartphone, a television, a tablet PC, a mobile phone, a video phone, an e-book reader, a desktop PC, a laptop PC, a netbook computer, a workstation, a server, a PDA, a portable multimedia player (PMP), an MP3 player, a medical device, a camera, a wearable device, and the like, the disclosure may be applied thereto.

The display device DD may be provided in various forms. For example, the display device DD may be provided in the form of a rectangular plate having two pairs of sides parallel to each other, but the disclosure is not limited thereto.

In FIGS. 1 and 2, the display device DD is shown as having corner portions made of straight lines, but the disclosure is not limited thereto. For example, the display device DD may have a side surface formed of at least one curved surface.

For convenience of description, the display device DD may have a display surface (e.g., display area DA) corresponding to a plane defined by a first direction DR1 and a second direction DR2 intersecting the first direction DR1. A direction perpendicular to an upper side with respect to the first direction DR1 and the second direction DR2 is defined as a third direction DR3.

In an embodiment, the display device DD may be a flat panel display device. For example, at least a portion of the display area DA may be curved, or a flexible display device.

In an embodiment, the display device DD may include a substrate SUB and a pixel PXL disposed on the substrate SUB. Although not shown in the drawings, the display device DD may further include a driving circuit part (e.g., a scan driver and a data driver) for driving the pixel PXL, wirings, pads, or the like.

The substrate SUB may constitute a base member of the display device DD. The substrate SUB may be a rigid or flexible substrate or film, but is not limited to specific examples.

The display area DA may mean an area in which the pixel PXL is disposed.

The non-display area NDA may mean an area in which the pixel PXL is not disposed. The non-display area NDA may mean an area other than the display area DA. The non-display area NDA may surround at least a portion of the display area DA.

The driving circuit part, the wirings, and the pads may be connected to the pixel PXL of the display area DA, and may be disposed in the non-display area NDA.

In an embodiment, each of the pixels PXL may emit one of red light, green light, and blue light. However, the color, type, and/or number of the pixels PXL is not limited to the examples. For example, the pixel PXL may emit white light.

Figure 3:
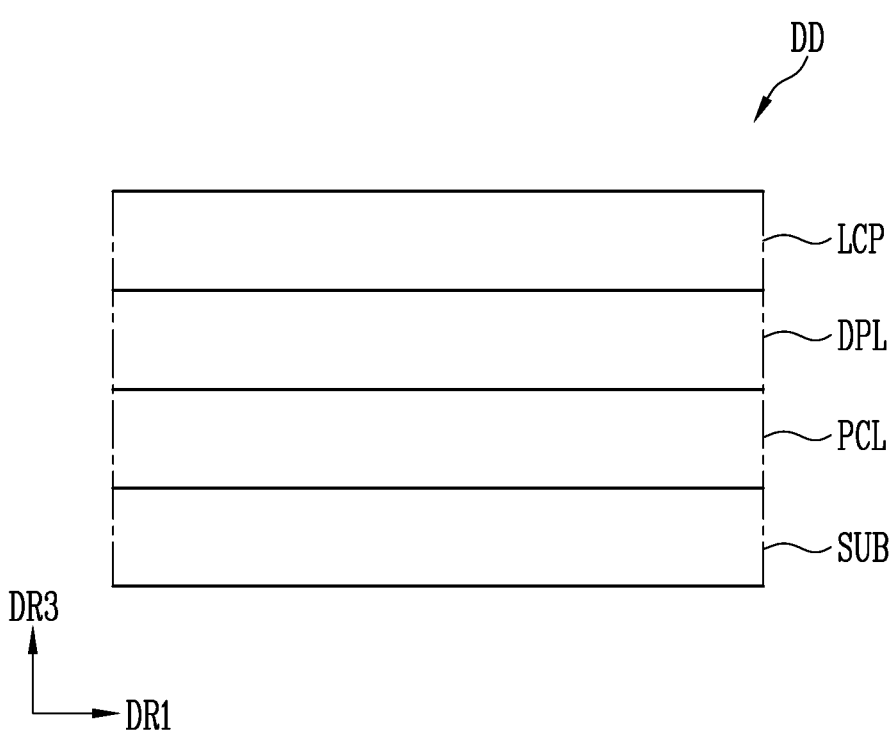
FIG. 3 is a schematic cross-sectional view schematically illustrating an example of the display device of FIG. 2.

FIG. 3 is a schematic cross-sectional view schematically illustrating an example of the display device of FIG. 2.

Referring to FIGS. 2 and 3, the display device DD may include the substrate SUB, a pixel circuit layer PCL, a display element layer DPL, and a light control layer LCP.

The substrate SUB, the pixel circuit layer PCL, the display element layer DPL, and the light control layer LCP may be sequentially stacked in the third direction DR3.

The substrate SUB may be made of an insulating material such as glass or resin. The substrate SUB may be made of a material having flexibility to be bent or folded. The substrate SUB may have a single-layer structure or a multi-layer structure. For example, the material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB is not limited to the above-described embodiments.

The substrate SUB may include the display area DA and the non-display area NDA. The display area DA may be an area in which the pixels PXL are provided to display an image. The non-display area NDA may be an area in which the pixels PXL are not provided and may be an area in which an image is not displayed.

The pixel circuit layer PCL may be disposed on the substrate SUB. The pixel circuit layer PCL may include a pixel circuit configured to drive a light emitting element of the pixel PXL. For example, the pixel circuit layer PCL may include transistors and signal lines/power source lines electrically connected to the transistors. The pixel circuit layer PCL may have a stacked structure for forming transistors.

The display element layer DPL may be disposed on the pixel circuit layer PCL. The display element layer DPL may include light emitting elements. The light emitting elements may be electrically connected to pixel circuits of the pixel circuit layer PCL.

In an embodiment, the light emitting elements may be inorganic light emitting elements including an inorganic light emitting material. However, this is an example, and the light emitting elements may include organic light emitting elements or light emitting elements (e.g., quantum dot display elements) that emit light by changing a wavelength of light emitted using quantum dots.

The light control layer LCP may be disposed on the display element layer DPL. The light control layer LCP may change a wavelength of light provided from the display element layer DPL (e.g., the light emitting elements). In an embodiment, the light control layer LCP may include a color conversion layer for changing a wavelength of light and a color filter layer for transmitting light having a wavelength.

In an embodiment, a touch sensor for receiving a user's touch input (or touch event) and a window for protecting an exposed surface of the display device DD may be additionally provided on the light control layer LCP.

Figure 4:
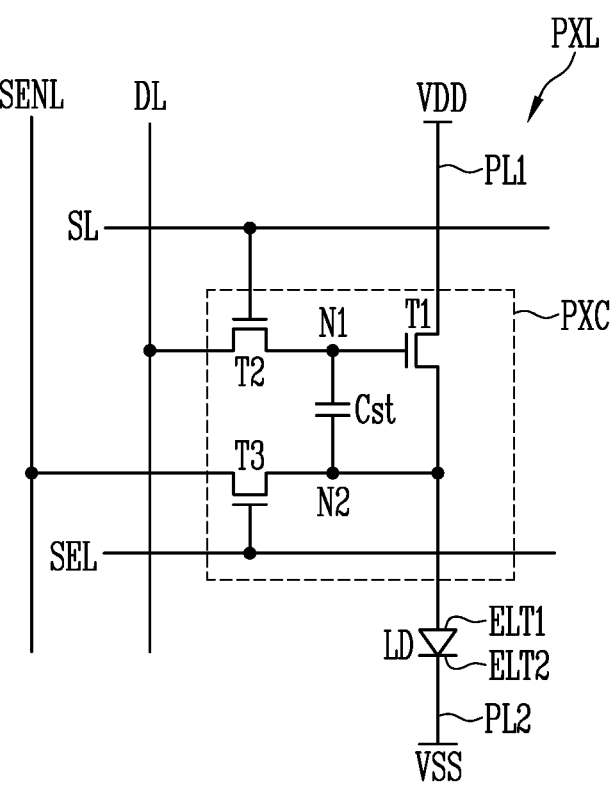
FIG. 4 is a schematic diagram of an equivalent circuit illustrating an example of a pixel included in the display device of FIG. 2.

FIG. 4 is a schematic diagram of an equivalent circuit illustrating an example of a pixel included in the display device of FIG. 2.

As an embodiment, FIG. 4 shows an electrical connection relationship between components included in a pixel PXL applied to an active display device. However, types of the components included in the pixel PXL to which the embodiment of the disclosure may be applied are not limited thereto.

Referring to FIGS. 2 and 4, the pixel PXL may include a light emitting element LD and a pixel circuit PXC.

The light emitting element LD may be electrically connected between a first power source line PL1 and a second power source line PL2. A voltage of a first power source VDD may be provided to the first power source line PL1, and a voltage of a second power source VSS may be provided to the second power source line PL2. For example, a potential of the first power source VDD may be set higher than that of the second power source VSS.

A first end EP1 (e.g., refer to FIG. 7) of the light emitting element LD may be electrically connected to the first power source line PL1 through a first electrode ELT1 of the light emitting element LD and the pixel circuit PXC. A second end EP2 (e.g., refer to FIG. 7) of the light emitting element LD may be electrically connected to the second power source line PL2 through a second electrode ELT2.

The light emitting element LD may emit light having a luminance corresponding to a driving current generated by the pixel circuit PXC.

FIG. 4 shows an embodiment in which one light emitting element LD is electrically connected between the pixel circuit PXC and the second power source line PL2, but this is only an example. The pixel PXL may include light emitting elements LD. For example, the light emitting elements LD may be electrically connected between the pixel circuit PXC and the second power source line PL2 in parallel, in series, or in a series/parallel mixed structure.

In an embodiment, the pixel circuit PXC may include a first transistor T1, a second transistor T2, a third transistor T3, and a storage capacitor Cst.

The first transistor T1 (e.g., driving transistor) may be electrically connected between the first power source line PL1 and the first electrode ELT1. A gate electrode of the first transistor T1 may be electrically connected to a first node N1. The first transistor T1 may control the driving current based on a voltage applied through the first node N1.

The second transistor T2 may be electrically connected between a data line DL and the first node N1. A gate electrode of the second transistor T2 may be electrically connected to a scan line SL. In case that a scan signal is supplied to the scan line SL, the second transistor T2 may be turned on to transmit a data signal (e.g., data voltage) to the first node N1.

The third transistor T3 may be electrically connected between a sensing line SENL and a second node N2. A gate electrode of the third transistor T3 may be electrically connected to a sensing scan line SEL. In case that the third transistor T3 is turned on in response to a sensing scan signal provided to the sensing scan line SEL, a reference voltage may be provided to the second node N2 through the sensing line SENL or a current (e.g., a sensing current) generated by the first transistor T1 may flow to the sensing line SENL. For example, the reference voltage may be set to be less than or equal to the voltage of the second power source VSS.

In an embodiment, the sensing current may be used to calculate the amount of change in mobility and threshold voltage of the first transistor T1.

The storage capacitor Cst may be electrically connected between the first node N1 and the second node N2. The storage capacitor Cst may store information on a difference between a voltage of the first node N1 and a voltage of the second node N2.

A structure of the pixel circuit PXC is not limited to the structure shown in FIG. 4 and may be implemented in various types of structures. Although the first to third transistors T1 to T3 are shown as N-type transistors in FIG. 4, the disclosure is not limited thereto. According to an embodiment, at least one of the first to third transistors T1 to T3 may be configured as a P-type transistor.

Figure 5:
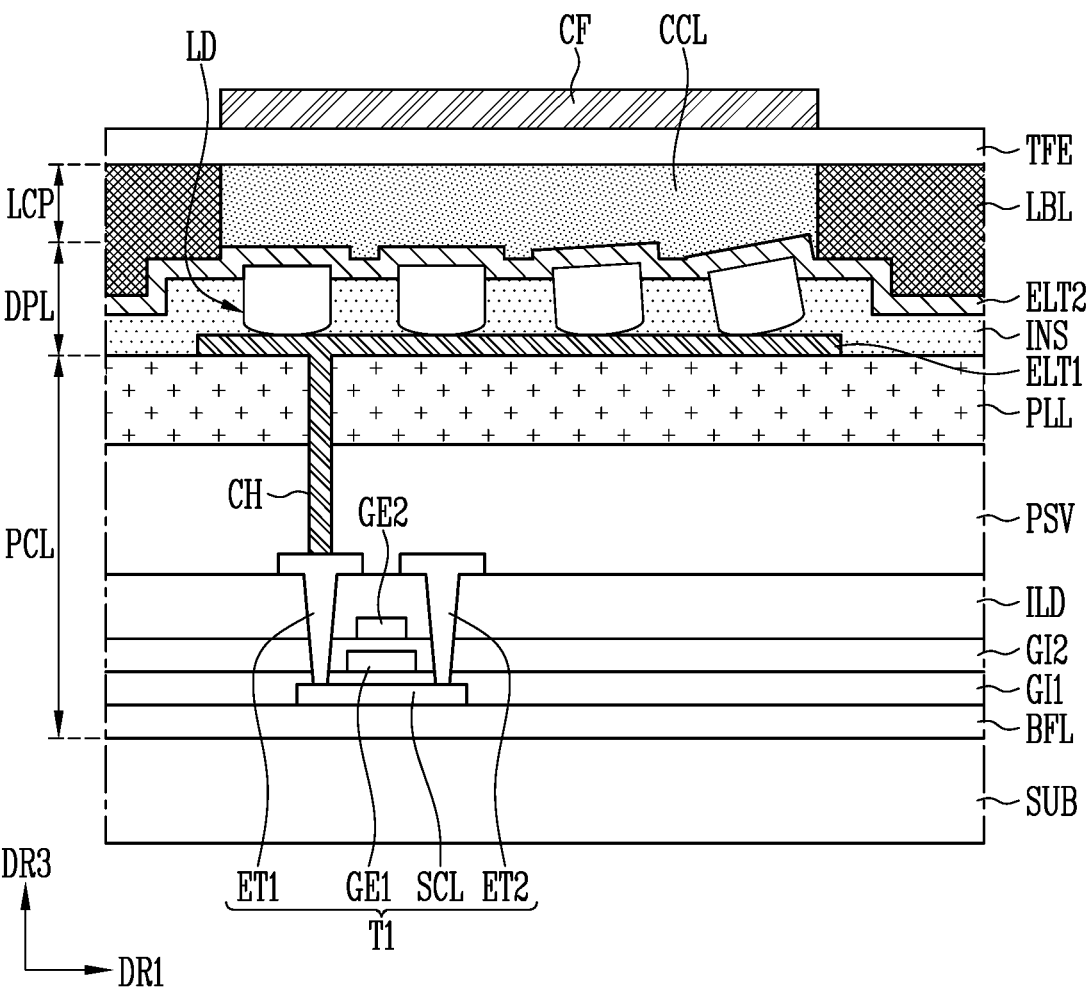
FIG. 5 is a schematic cross-sectional view illustrating an example of the display device of FIG. 2.
Figure 6:
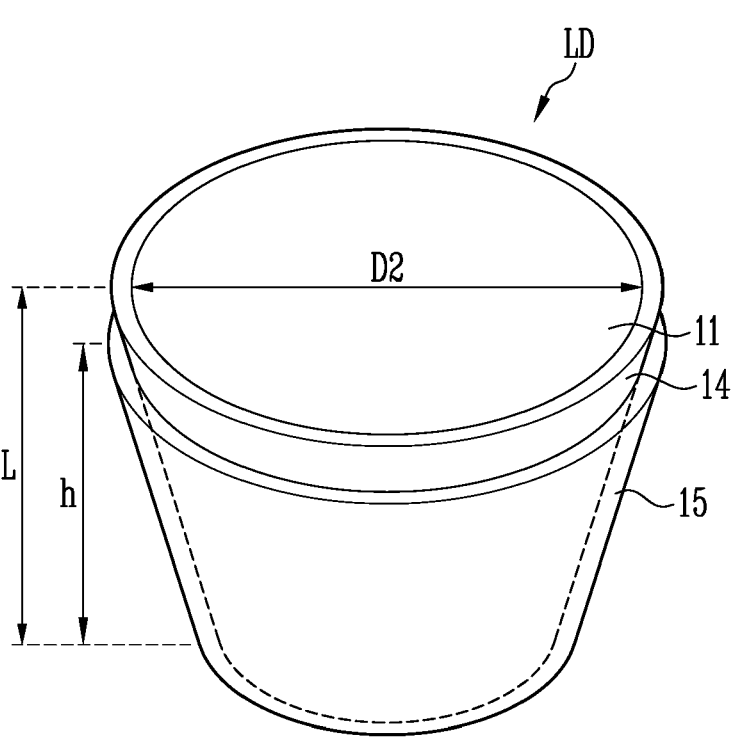
FIG. 6 is a schematic perspective view illustrating an example of a light emitting element included in the display device of FIG. 5.
Figure 7:
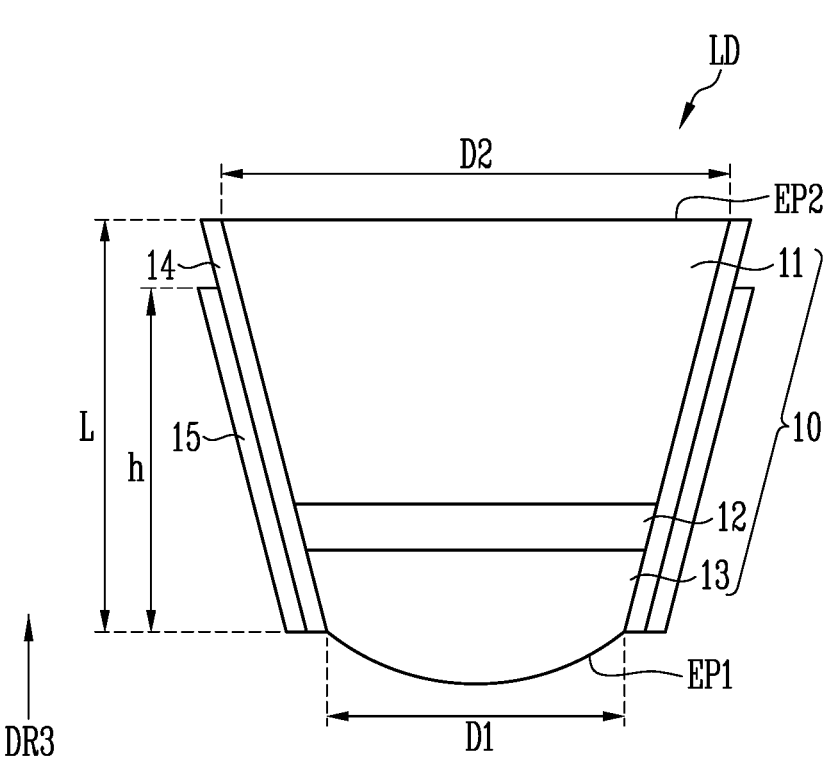
FIG. 7 is a schematic cross-sectional view illustrating an example of the light emitting element of FIG. 6.

FIG. 5 is a schematic cross-sectional view illustrating an example of the display device of FIG. 2. FIG. 6 is a schematic perspective view illustrating an example of a light emitting element included in the display device of FIG. 5. FIG. 7 is a schematic cross-sectional view illustrating an example of the light emitting element of FIG. 6.

Referring to FIGS. 2 to 7, the display device DD may include the substrate SUB, the pixel circuit layer PCL, the display element layer DPL, and the light control layer LCP. The display device DD may further include an encapsulation layer TFE (or thin film encapsulation layer).

The pixel circuit layer PCL disposed on the substrate SUB may include insulating layers and conductive layers. The insulating layers may include, for example, a buffer layer BFL, a first gate insulating layer GI1, a second gate insulating layer GI2, an interlayer insulating layer ILD, a passivation layer PSV, and a planarization layer PLL. For example, the buffer layer BFL, the first gate insulating layer GI1, the second gate insulating layer GI2, the interlayer insulating layer ILD, the passivation layer PSV, and the planarization layer PLL may be sequentially provided on the substrate SUB. The conductive layers may include, for example, a first conductive layer provided on the first gate insulating layer GI1, a second conductive layer provided on the second gate insulating layer GI2, a third conductive layer provided on the interlayer insulating layer ILD, and a fourth conductive layer provided on the planarization layer PLL. However, the insulating layers and the conductive layers provided on the substrate SUB are not limited to the above-described embodiment. In addition to the above-described insulating layers and conductive layers, other insulating layers and/or other conductive layers may be provided on the substrate SUB.

The buffer layer BFL may be provided on the substrate SUB. The buffer layer BFL may prevent impurities from diffusing into the pixel circuit PXC. The buffer layer BFL may include an inorganic insulating layer including an inorganic material. For example, the buffer layer BFL may include at least one of metal oxides such as silicon nitride ($SiN_x$), silicon oxide ($SiO_x$), silicon oxynitride ($SiO_xN_y$), and aluminum oxide ($AlO_x$).

The buffer layer BFL may be provided as a single layer, but may also be provided as a multi-layer of at least a double layer. In case that the buffer layer BFL is provided as a multi-layer, each layer may be formed of the same material or may be formed of different materials. The buffer layer BFL may be omitted depending on the material of the substrate SUB, process conditions, and the like.

The first transistor T1 may include a semiconductor pattern SCL, a first gate electrode GE1, a first transistor electrode ET1, and a second transistor electrode ET2. The first transistor electrode ET1 may be one of a source electrode and a drain electrode, and the second transistor electrode ET2 may be another one of the source electrode and the drain electrode. For example, the first transistor electrode ET1 may be the drain electrode, and the second transistor electrode ET2 may be the source electrode.

In an embodiment, the second and third transistors T2 and T3 may also be formed in substantially the same stacked structure as the first transistor T1.

The semiconductor pattern SCL may be provided (or formed) on the buffer layer BFL. The semiconductor pattern SCL may include a first contact region in contact with the first transistor electrode ET1 and a second contact region in contact with the second transistor electrode ET2. A region of the semiconductor pattern SCL between the first contact region and the second contact region may be a channel region. The channel region of the semiconductor pattern SCL may overlap the first gate electrode GE1 of the first transistor T1 in a plan view. The semiconductor pattern SCL may be a semiconductor pattern made of polysilicon, amorphous silicon, oxide semiconductor, or the like. The channel region of the semiconductor pattern SCL may be, for example, a semiconductor pattern that is not doped with impurities, and may be an intrinsic semiconductor. The first contact region and the second contact region of the semiconductor pattern SCL may be semiconductor patterns doped with impurities.

The first gate electrode GE1 may be provided on the first gate insulating layer GI1 of the semiconductor pattern SCL. The first gate electrode GE1 may overlap the channel region of the semiconductor pattern SCL in a plan view. In an embodiment, the first gate electrode GE1 may be included in the first conductive layer.

The first gate electrode GE1 may include at least one selected from a group consisting of copper (Cu), molybdenum (Mo), tungsten (W), aluminum neodymium (AlNd), titanium (Ti), aluminum (Al), and silver (Ag). In other embodiments, the first gate electrode GE1 may include alloys or a mixture thereof. The first gate electrode GE1 may have a single-layer structure or a multi-layer structure.

The first gate insulating layer GI1 may be an inorganic insulating layer including an inorganic material. For example, the first gate insulating layer GI1 may include at least one of metal oxides such as silicon nitride ($SiN_x$), silicon oxide ($SiO_x$), silicon oxynitride ($SiO_xN_y$), and aluminum oxide ($AlO_x$). However, the material of the first gate insulating layer GI1 is not limited to the above-described embodiments. According to an embodiment, the first gate insulating layer GI1 may be formed of an organic insulating layer including an organic material. The first gate insulating layer GI1 may be provided as a single layer or a multi-layer.

The first transistor electrode ET1 and the second transistor electrode ET2 may be provided on the interlayer insulating layer ILD, and may be in contact with the first contact region and the second contact region of the semiconductor pattern SCL through contact holes sequentially penetrating the first and second gate insulating layers GI1 and GI2 and the interlayer insulating layer ILD, respectively. For example, the first transistor electrode ET1 may contact the first contact region of the semiconductor pattern SCL, and the second transistor electrode ET2 may contact the second contact region of the semiconductor pattern SCL. Each of the first and second transistor electrodes ET1 and ET2 may include the same material as the first gate electrode GE1, or may include one or more materials selected from at least one material constituting the first gate electrode GE1. In an embodiment, the first transistor electrode ET1 and the second transistor electrode ET2 may be included in the third conductive layer.

The interlayer insulating layer ILD may include the same material as the first gate insulating layer GI1, or may include one or more materials selected from at least one material constituting the first gate insulating layer GI1.

In an embodiment, the first transistor T1 may be composed of a low-temperature polysilicon (LTPS) thin film transistor, but the disclosure is not limited thereto. According to an embodiment, at least one of transistors including the first transistor T1 may be composed of an oxide semiconductor thin film transistor. In the above-described embodiment, a case in which the first transistor T1 is a thin film transistor having a top gate structure has been described as an example, but the disclosure is not limited thereto, and the structure of the transistors may be variously changed.

The pixel circuit layer PCL may further include a second gate electrode GE2. The second gate electrode GE2 may be provided on the second gate insulating layer GI2. In an embodiment, the second gate electrode GE2 may be included in the second conductive layer positioned between the first conductive layer and the third conductive layer. The second gate electrode GE2 may include a gate electrode, a power source line, or a signal line of another transistor (not shown), or may form a capacitor with another conductor or another conductive layer. The second gate electrode GE2 may include the same material as the first gate electrode GE1, or may include one or more materials selected from at least one material constituting the first gate electrode GE1.

The second gate insulating layer GI2 may include the same material as the first gate insulating layer GI1, or may include one or more materials selected from at least one material constituting the first gate insulating layer GI1.

The passivation layer PSV may be provided (or formed) on the first transistor T1.

The passivation layer PSV may be provided in a form including an organic insulating layer, an inorganic insulating layer, or an organic insulating layer disposed on the inorganic insulating layer. The inorganic insulating layer may include, for example, at least one of metal oxides such as silicon oxide ($SiO_x$), silicon nitride ($SiN_x$), silicon oxynitride ($SiO_xN_y$), and aluminum oxide ($AlO_x$). The organic insulating layer may include, for example, at least one of poly-acrylates resin, epoxy resin, phenolic resin, polyamides resin, polyimides resin, unsaturated polyesters resin, poly-phenylen ethers resin, poly-phenylene sulfides resin, and benzocyclobutene resin.

In an embodiment, the passivation layer PSV may include a contact hole CH exposing the first transistor electrode ET1 of the first transistor T1 to outside thereof.

The planarization layer PLL may be provided on the passivation layer PSV. The planarization layer PLL may alleviate a step difference caused by components disposed thereunder. To this end, the planarization layer PLL may be formed of an organic insulating layer including an organic material.

In an embodiment, the contact hole CH exposing the first transistor electrode ET1 of the first transistor T1 to the outside may be formed to pass through the passivation layer PSV and the planarization layer PLL.

According to an embodiment, the planarization layer PLL may be omitted.

The display element layer DPL may be provided on the planarization layer PLL. The display element layer DPL may include the first electrode ELT1, the light emitting element LD, an insulating layer INS, and the second electrode ELT2.

The first electrode ELT1 may be provided on the pixel circuit layer PCL. The first electrode ELT1 may be electrically connected to a first end EP1 of each of the light emitting elements LD. The second electrode ELT2 may be provided on the light emitting elements LD and may be electrically connected to a second end EP2 of each of the light emitting elements LD. In a cross-sectional view, the first electrode ELT1 and the second electrode ELT2 may face each other with the light emitting elements LD interposed therebetween.

The first electrode ELT1 may be electrically and/or physically connected to the first transistor electrode ET1 of the first transistor T1 through the contact hole CH. In an embodiment, the first electrode ELT1 may be an anode. The first electrode ELT1 may be the first electrode ELT1 shown in FIG. 4.

The first electrode ELT1 may be made of a material having a reflectance so that light emitted from each of the light emitting elements LD may travel in a direction in which an image is displayed on the display device (e.g., a front direction). For example, the first electrode ELT1 may include an opaque metal. The opaque metal of the first electrode ELT1 may include, for example, a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti). In other embodiments, the opaque metal of the first electrode ELT1 may include alloys thereof.

According to an embodiment, the first electrode ELT1 may include a transparent conductive material. The transparent conductive material of the first electrode ELT1 may include at least one conductive oxide such as indium tin oxide (ITO), indium zinc oxide (IZO), zinc oxide (ZnO), indium gallium zinc oxide (IGZO), and indium tin zinc oxide (ITZO). In other embodiments, the transparent conductive material of the first electrode ELT1 may include a conductive polymer such as poly(3,4-ethylenedioxythiophene) (PEDOT).

In case that the first electrode ELT1 includes a transparent conductive material, a separate conductive layer made of an opaque metal may be added (e.g., added on first electrode ELT1) so that light emitted from each of the light emitting elements LD is reflected in a direction in which an image is displayed on the display device. However, the material of the first electrode ELT1 is not limited to the above-described materials.

The first electrode ELT1 may be provided as a single layer, but the disclosure is not limited thereto. According to an embodiment, the first electrode ELT1 may be provided as a multi-layer in which at least two or more of metals, alloys, conductive oxides, and conductive polymers are stacked. For example, the first electrode ELT1 may be formed of a multi-layer sequentially stacked in the order of indium tin oxide (ITO)/silver (Ag)/indium tin oxide (ITO).

The light emitting elements LD may be provided on the first electrode ELT1. In an embodiment, the light emitting elements LD may be bonded (or coupled) to the first electrode ELT1. For example, the first end EP1 of each of the light emitting elements LD may be in contact (e.g., direct contact) with the first electrode ELT1. The light emitting elements LD may form a pixel PXL.

The light emitting elements LD may be provided on the first electrode ELT1, and the light emitting elements LD may be bonded (or coupled) to a conductive pattern (CP). As shown in FIGS. 6 and 7, the light emitting element LD may include a first semiconductor layer 11, a second semiconductor layer 13, and an active layer 12 interposed between the first and second semiconductor layers 11 and 13. For example, the light emitting element LD may include a light emitting stacked structure 10 in which the second semiconductor layer 13, the active layer 12, and the first semiconductor layer 11 are sequentially stacked.

The light emitting element LD may be provided in a shape extending in a direction. In case that the direction in which the light emitting element LD extends is referred to as a length L direction, the light emitting element LD may include the first end EP1 (or a lower end) and the second end EP2 (or an upper end) in the extending direction. In an embodiment, the length L direction may be parallel to the third direction DR3.

Any one of the first semiconductor layer 11 and the second semiconductor layer 13 may be positioned at the first end EP1 of the light emitting element LD, and the remainder of the first semiconductor layer 11 and the second semiconductor layer 13 may be positioned at the second end EP2 of the light emitting element LD. For example, the second semiconductor layer 13 may be positioned at the first end EP1 of the light emitting element LD, and the first semiconductor layer 11 may be disposed at the second end EP2 of the light emitting element LD.

The light emitting element LD may be provided in various shapes. For example, the light emitting element LD may have a rod-like shape or a bar-like shape elongated in the length L direction (e.g., having an aspect ratio greater than 1). In another example, the light emitting element LD may have a rod-like shape or a bar-like shape formed short in the length L direction (e.g., having an aspect ratio less than 1).

In an embodiment, the light emitting element LD may have a shape in which a diameter D1 of the first end EP1 and a diameter D2 of the second end EP2 are different from each other. For example, each light emitting element LD may have a shape in which the diameter D1 of the first end EP1 is smaller than the diameter D2 of the second end EP2. For example, the light emitting element LD may have a shape in which a diameter increases upward in the third direction DR3.

However, this is an example, and the diameter D1 of the first end EP1 may be smaller than or equal to the diameter D2 of the second end EP2. Also, according to an embodiment, the length L of each light emitting element LD may be the same as the diameter D1 of the first end EP1 or the diameter D2 of the second end EP2.

The light emitting element LD may include an ultra-small light emitting diode (LED) having the diameter and/or the length L of about a nanometer-scale to a micrometer-scale.

The size of the light emitting element LD may be variously changed to meet the requirements (or design conditions) of a lighting device or the display device DD to which the light emitting element LD is applied.

The first end EP1 of the light emitting element LD may include a curved surface. In an embodiment, the first end EP1 may have the curved surface in the form of a round convex toward outside of the light emitting element LD. For example, the first end EP1 may have a dome shape, a hemispherical shape, or the like. A portion of the first end EP1 may be in contact (e.g., direct contact) with the first electrode ELT1.

Also, the first end EP1 may include a portion that does not contact the first electrode ELT1.

In an embodiment, the second semiconductor layer 13 may include at least one p-type semiconductor layer. For example, the second semiconductor layer 13 may include a p-type semiconductor layer including at least one semiconductor material of InAlGaN, GaN, AlGaN, InGaN, AlN, and InN, and doped with a second conductive dopant (or a p-type dopant) such as Mg, Zn, Ca, Sr, Ba, or the like. However, the material constituting the second semiconductor layer 13 is not limited thereto.

The second semiconductor layer 13 may include an upper surface in contact with the active layer 12 and a lower surface (e.g., the first end EP1) exposed to the outside in the length L direction of the light emitting element LD. Accordingly, the second semiconductor layer 13 may include the curved surface corresponding to the first end EP1.

The active layer 12 may be disposed on the second semiconductor layer 13 and may be formed in a single or multiple quantum well structure. For example, in case that the active layer 12 is formed in a multiple quantum well structure, the active layer 12 may be formed by periodically and repeatedly stacking a barrier layer (not shown), a strain reinforcing layer, and a well layer as a unit. The strain reinforcing layer of the active layer 12 may have a smaller lattice constant than the barrier layer, so that the strain applied to the well layer, for example, the compressive strain, may be further strengthened. However, a structure of the active layer 12 is not limited to the above-described embodiment.

In an embodiment, the active layer 12 may emit light having a wavelength in a range of about 400 nm to about 900 nm, and a double hetero structure may be used.

In an embodiment, a clad layer doped with a conductive dopant may be formed on upper and/or lower portions of the active layer 12. For example, the clad layer may be formed of an AlGaN layer or an InAlGaN layer. According to an embodiment, a material such as AlGaN or InAlGaN may be used to form the active layer 12, and various other materials may be used to form the active layer 12. The active layer 12 may include a first surface in contact with the second semiconductor layer 13 and a second surface in contact with the first semiconductor layer 11.

In case that a signal (or voltage) is applied to each of the first end EP1 and the second end EP2 of the light emitting element LD, electron-hole pairs may be combined in the active layer 12, and the light emitting element LD may emit light.

The first semiconductor layer 11 may be disposed on the active layer 12, and may include a semiconductor layer of a different type from that of the second semiconductor layer 13. For example, the first semiconductor layer 11 may include at least one n-type semiconductor layer. For example, the first semiconductor layer 11 may be an n-type semiconductor layer including at least one semiconductor material of InAlGaN, GaN, AlGaN, InGaN, AlN, and InN, and doped with a first conductive dopant (or an n-type dopant) such as Si, Ge, Sn, or the like. However, the material constituting the first semiconductor layer 11 is not limited thereto, and various other materials may be used to form the first semiconductor layer 11.

The first semiconductor layer 11 may include a lower surface in contact with the active layer 12 and an upper surface exposed to the outside. The upper surface of the first semiconductor layer 11 may be the second end EP2 of the light emitting element LD.

In an embodiment, the second semiconductor layer 13 and the first semiconductor layer 11 may have different thicknesses in the third direction DR3 of each light emitting element LD.

Although an embodiment in which each of the first semiconductor layer 11 and the second semiconductor layer 13 is formed of a layer is shown, the disclosure is not limited thereto. In an embodiment, depending on the material of the active layer 12, each of the first semiconductor layer 11 and the second semiconductor layer 13 may further include at least one or more layers, for example, a clad layer and/or a tensile strain barrier reducing (TSBR) layer. The TSBR layer may be a strain relief layer disposed between semiconductor layers (e.g., first semiconductor 11, active layer 12, second semiconductor layer 13, or the like) having different lattice structures to serve as a buffer to reduce a lattice constant difference. The TSBR layer may be formed of a p-type semiconductor layer such as p-GaInP, p-AlInP, or p-Al-GaInP, but the disclosure is not limited thereto.

In an embodiment, the light emitting element LD may further include at least one of an additional electrode (hereinafter, referred to as a first additional electrode, not shown) disposed below the second semiconductor layer 13 and another additional electrode (hereinafter, referred to as a second additional electrode, not shown) disposed above the first semiconductor layer 11.

Each of the first and second additional electrodes may be an ohmic contact electrode, but the disclosure is not limited thereto. According to an embodiment, the first and second additional electrodes may be Schottky contact electrodes. The first and second additional electrodes may include a conductive material. For example, the first and second additional electrodes may include an opaque metal or a transparent conductive oxide.

In an embodiment, the light emitting element LD may further include an insulating film 14. However, according to an embodiment, the insulating film 14 may be omitted, or may be provided to cover only a portion of the light emitting stacked structure 10.

The insulating film 14 may prevent an electrical short circuit that may be caused by the active layer 12 being in contact with a conductive material other than the first and second semiconductor layers 11 and 13. The insulating film 14 may minimize surface defects of the light emitting element LD to improve the lifespan and luminous efficiency of the light emitting element LD. The insulating film 14 may prevent an unwanted short circuit that may occur between adjacent light emitting elements LD.

The insulating film 14 may be provided in a form that surrounds (e.g., entirely surrounds) at least a portion of an outer surface of the light emitting stacked structure 10. In an embodiment, a portion of the second semiconductor layer 13 that is not surrounded by the insulating film 14 may be understood as the first end EP1.

In an embodiment, the insulating film 14 may include a transparent insulating material. For example, the insulating film 14 may include at least one insulating material selected from a group consisting of silicon oxide (SiO$_x$), silicon nitride (SiN$_x$), silicon oxynitride (SiO$_x$N$_y$), aluminum oxide (AlO$_x$), titanium oxide (TiO$_x$), hafnium oxide (HfO$_x$), titanium strontium oxide (SrTiO$_x$), cobalt oxide (Co$_x$O$_y$), magnesium oxide (MgO), zinc oxide (ZnO), ruthenium oxide (RuO$_x$), nickel oxide (NiO), tungsten oxide (WO$_x$), tantalum oxide (TaO$_x$), gadolinium oxide (GdO$_x$), zirconium oxide (ZrO$_x$), gallium oxide (GaO$_x$), vanadium oxide (V$_x$O$_y$), ZnO:Al, ZnO:B, InxOy:H, niobium oxide (Nb$_x$O$_y$), magnesium fluoride (MgF$_x$), aluminum fluoride (AlF$_x$), alucone polymer film, titanium nitride (TiN), tantalum nitride (TaN), aluminum nitride (AlN$_x$), gallium nitride (GaN), tungsten nitride (WN), hafnium nitride (HfN), niobium nitride (NbN), gadolinium nitride (GdN), zirconium nitride (ZrN), vanadium nitride (VN), and the like. However, the disclosure is not limited thereto, and various materials having insulating properties may be used as the material of the insulating film 14.

The insulating film 14 may be provided in the form of a single layer, or may be provided in the form of multiple layers including at least a double layer.

Each light emitting element LD may further include a reflective member 15 surrounding at least a portion of an outer surface of the insulating film 14.

The reflective member 15 may be made of a material having a reflectance. Thus, light emitted from the light emitting element LD may travel in a direction in which an image is displayed and may be focused on an area. For example, the reflective member 15 may include an opaque metal having a reflectance. The reflective member 15 may include the same material as the first electrode ELT1, or may include one or more materials selected from at least one material constituting the first electrode ELT1.

The above-described reflective member 15 may partially surround the outer surface of the insulating film 14, and expose a portion of the insulating film 14. A height h of the reflective member 15 in the third direction DR3 may be smaller than the length L of each light emitting element LD.

The light emitting element LD may be a light emitting element having a vertical structure in which the second semiconductor layer 13, the active layer 12, and the first semiconductor layer 11 are sequentially stacked in the third direction DR3.

In an embodiment, as shown in FIG. 5, at least some of the light emitting elements LD may be disposed to be inclined with respect to the third direction DR3. For example, the light emitting elements LD may be transferred onto the pixel circuit layer PCL by a stamp method. In a process of separating a transfer film from the light emitting elements LD, some of the light emitting elements LD may be inclined or collapsed.

The first end EP1 of each of the light emitting elements LD according to the embodiments of the disclosure may include the curved surface. Accordingly, even if the light emitting element LD is inclined at an angle, contact and conduction between the first end EP1 and the first electrode ELT1 may be maintained.

In an embodiment, the second end EP2 of the light emitting element LD inclined with respect to the third direction DR3 may have an inclined surface with respect to a direction parallel to the substrate SUB (e.g., the second direction DR2).

The insulating layer INS may be provided on the planarization layer PLL and may cover the first electrode ELT1. The insulating layer INS may include an inorganic insulating layer including an inorganic material or an organic insulating layer including an organic material. In an embodiment, the insulating layer INS may be used as a planarization layer for alleviating a step difference due to components disposed below the display element layer DPL. To this end, the insulating layer INS may be formed of an organic insulating layer including an organic material.

Also, the insulating layer INS may be provided between the light emitting elements LD. Since the insulating layer INS is positioned between the light emitting elements LD, portions other than the second end EP2 of each light emitting element LD may be covered by the insulating layer INS.

The second electrode ELT2 may be provided on the second end EP2 of each of the light emitting elements LD. The second electrode ELT2 may be in contact with the second end EP2 of each of the light emitting elements LD and may be electrically connected to the second end EP2. For example, the second electrode ELT2 may be electrically and physically connected to the first semiconductor layer 11 corresponding to the second end EP2.

In an embodiment, the second electrode ELT2 may be formed of a transparent conductive material. For example, the second electrode ELT2 may include at least one of various transparent conductive materials including at least one of ITO, IZO, ZnO, IGZO, ITZO, and the like, and may be configured to be substantially transparent or translucent to satisfy a light transmittance. However, the material of the second electrode ELT2 is not limited to the above-described embodiment.

An upper surface of the second electrode ELT2 having a very thin thickness may have a step difference due to the inclined light emitting elements. For example, the upper surface of the second electrode ELT2 may not be flat.

The light control layer LCP may be disposed on the display element layer DPL. The light control layer LCP may include a light blocking layer LBL and a color conversion layer CCL.

The light blocking layer LBL may define an emission area from which light is emitted from the pixel PXL and a non-emission area in which emitting light is blocked. The light blocking layer LBL may include an opening corresponding to the emission area.

The light blocking layer LBL may include a photosensitive material made of a light blocking material or the like. The light blocking layer LBL may prevent color mixing of light emitted from each of the adjacent pixels. The light blocking layer LBL may be made of a material that absorbs or blocks incident light, and may absorb the light incident on the display device from the outside. Thus, the light blocking layer LBL may prevent components positioned thereunder from being visually recognized from the outside.

In an embodiment, the light blocking layer LBL may be formed of a positive photosensitive material. For example, the positive photosensitive material may include a positive photosensitive resin.

The color conversion layer CCL may be disposed in the opening of the light blocking layer LBL. For example, the color conversion layer CCL may overlap the light emitting elements LD in a plan view.

The color conversion layer CCL may include a wavelength conversion pattern. The color conversion layer CCL may include quantum dots as a color conversion material that converts light emitted from the light emitting element LD into light of a color. For example, the color conversion layer CCL may include quantum dots dispersed in a matrix material such as a base resin. The color conversion layer CCL may include quantum dots that convert light of the color emitted from the light emitting element LD into light of another color (e.g., white light).

The encapsulation layer TFE may be disposed on the color conversion layer CCL and the light blocking layer LBL.

The encapsulation layer TFE may cover (e.g., directly cover) the color conversion layer CCL. The encapsulation layer TFE may prevent impurities such as moisture or air from penetrating from the outside to damage or contaminate the color conversion layer CCL and the light emitting element LD disposed thereunder. In an embodiment, a surface of the encapsulation layer TFE may be in contact with the color conversion layer CCL.

In an embodiment, the encapsulation layer TFE may include at least one organic material such as acrylates resin, epoxy resin, phenolic resin, polyamides resin, polyimides rein, polyesters resin, polyphenylenesulfides resin, and benzocyclobutene (BCB), but the material of the encapsulation layer TFE is not limited thereto.

In an embodiment, the encapsulation layer TFE may include at least one inorganic material such as silicon oxide $(SiO_x)$, silicon nitride $(SiN_x)$, silicon oxynitride $(SiO_xN_y)$, silicon oxycarbide $(SiO_xC_y)$, aluminum oxide $(AlO_x)$, aluminum nitride $(AlN_x)$, zirconium oxide $(ZrO_x)$, hafnium oxide $(HfO_x)$, or titanium oxide $(TiO_x)$.

In an embodiment, the encapsulation layer TFE may be formed of multiple layers. For example, the encapsulation layer TFE may have a stacked structure in which an inorganic material, an organic material, and an inorganic material are sequentially deposited.

In an embodiment, a color filter layer CF may be disposed on the encapsulation layer TFE. The color filter layer CF may selectively transmit light corresponding to the color of light emitted from the pixel PXL. For example, the color filter layer CF may include one of a red color filter, a green color filter, and a blue color filter according to the pixel PXL.

In an embodiment, a touch sensor layer may be further provided between the color filter layer CF and the encapsulation layer TFE. The touch sensor layer may include a conductive pattern for sensing a touch input (or touch event) and an insulating layer. The conductive pattern of the touch sensor layer may be composed of a single layer or a double layer formed with an insulating layer interposed therebetween.

Figure 8:
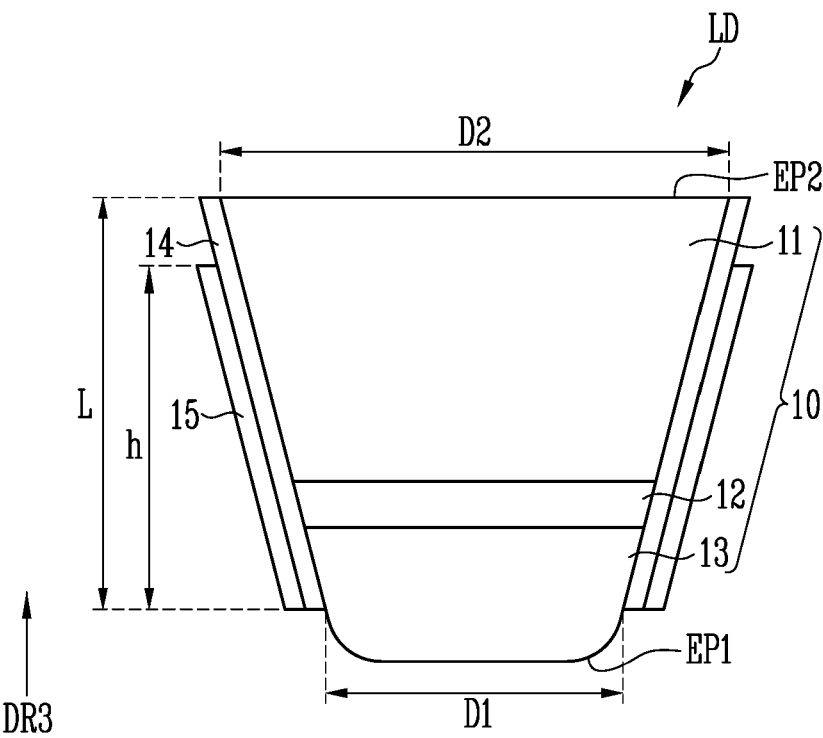
FIG. 8 is a schematic cross-sectional view illustrating an example of the light emitting element of FIG. 6.

FIG. 8 is a schematic cross-sectional view illustrating an example of the light emitting element of FIG. 6.

In FIG. 8, the same reference numerals are used for the components described with reference to FIG. 7, and repetitive descriptions of these components will be omitted. A light emitting element LD of FIG. 8 may have a configuration different from that of the light emitting element LD of FIG. 7 at least in a shape of the first end EP1.

Referring to FIGS. 5 and 8, the light emitting element LD may include a first semiconductor layer 11, a second semiconductor layer 13, and an active layer 12 interposed between the first and second semiconductor layers 11 and 13.

A first end EP1 of the light emitting element LD may include a curved surface in the form of a round convex toward outside of the light emitting element LD. The first end EP1 of the light emitting element LD may further include a flat portion extending from the curved surface. For example, the second semiconductor layer 13 may have a shape corresponding to the first end EP1.

Accordingly, in case that the light emitting element LD is not inclined or inclined at an angle or less, a contact area between the first end EP1 of the light emitting element LD and the first electrode ELT1 may be secured to the maximum.

FIGS. 9 to 18 are schematic cross-sectional views illustrating a method of manufacturing a display device according to embodiments of the disclosure.

In a method of manufacturing a display device of FIGS. 9 to 18, the same reference numerals are used for the components described with reference to FIGS. 5 to 8. Thus, repetitive description of the same constituent components is omitted.

Referring to FIGS. 9 to 18, the method of manufacturing a display device may include forming grooves GRV on a base substrate B_SUB; depositing a light emitting element layer LDL on the base substrate B_SUB; removing remaining portions of the light emitting element layer LDL except for portions overlapping the grooves GRV in a plan view to form light emitting elements LD1 to LD4; attaching a transfer film FLM to upper surfaces of the light emitting elements LD1 to LD4; removing the base substrate B_SUB to expose a first end EP1 of each of the light emitting elements LD1 to LD4; bonding the first end EP1 of each of the light emitting elements LD1 to LD4 to a first electrode ELT1 formed on a pixel circuit layer PCL; separating the transfer film FLM from the light emitting elements LD1 to LD4; forming an insulating layer INS on the first electrode ELT1 to fill gaps between the light emitting elements LD1 to LD4; and forming a second electrode ELT2 on the light emitting elements LD1 to LD4 and the insulating layer INS.

Figure 9:
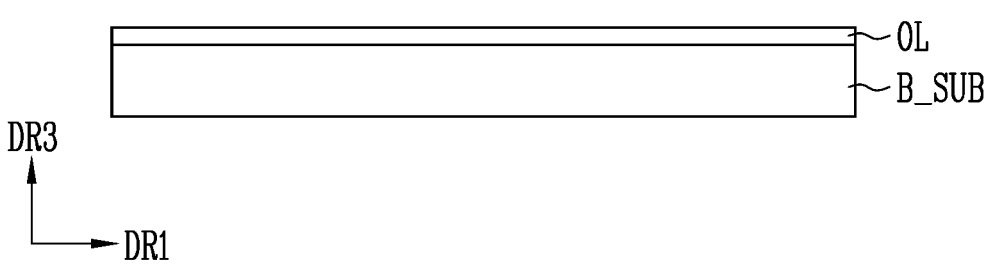
FIGS. 9 to 18 are schematic cross-sectional views illustrating a method of manufacturing a display device according to embodiments of the disclosure.

In an embodiment, as shown in FIG. 9, an organic layer OL may be formed on the base substrate B_SUB.

The base substrate B_SUB may be a base plate for laminating target materials. The base substrate B_SUB may be a wafer for epitaxially growing a material. According to an example, the base substrate B_SUB may be any one of a sapphire substrate, a silicon substrate, a GaAs substrate, a Ga substrate, and an InP substrate, but is not limited thereto. For example, in case that a material satisfies a selection ratio for manufacturing a light emitting element LD (e.g., LD1, LD2, LD3, and LD4 of FIG. 12), epitaxial growth may be performed smoothly, and the material may be selected as the material of the base substrate B_SUB.

The organic layer OL may include an organic material having high heat resistance. For example, the organic layer OL may include polyimides rein. However, this is an example, and the material of the organic layer OL is not limited thereto, and any suitable material for forming the first end EP1 including a curved surface may be used. For example, the organic layer OL may include at least one of an acrylates resin, an epoxy resin, a phenolic resin, a polyamides resin, or the like. The material disposed on the base substrate B_SUB is not limited to the organic material, and any material capable of forming the grooves GRV may be used.

Figure 10:
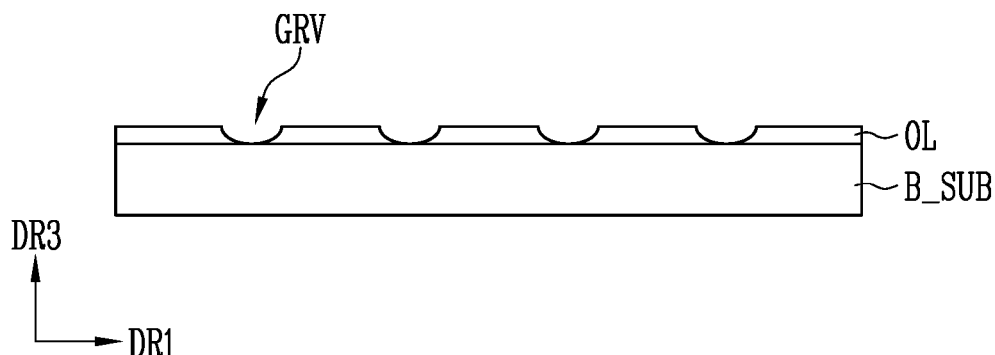

As shown in FIG. 10, the grooves GRV may be formed by patterning the organic layer OL to expose at least a portion of the base substrate B_SUB. The grooves GRV may have a curved shape convex in a direction opposite to the third direction DR3. For example, the grooves GRV may have a hemispherical shape or a lens shape.

The grooves GRV may be formed by a photolithography process or an etching process for the organic layer OL.

However, this is an example, and the grooves GRV may be formed by etching (e.g., directly etching) the base substrate B_SUB without adding a process of forming (or depositing) a thin film on the base substrate B_SUB.

Figure 11:
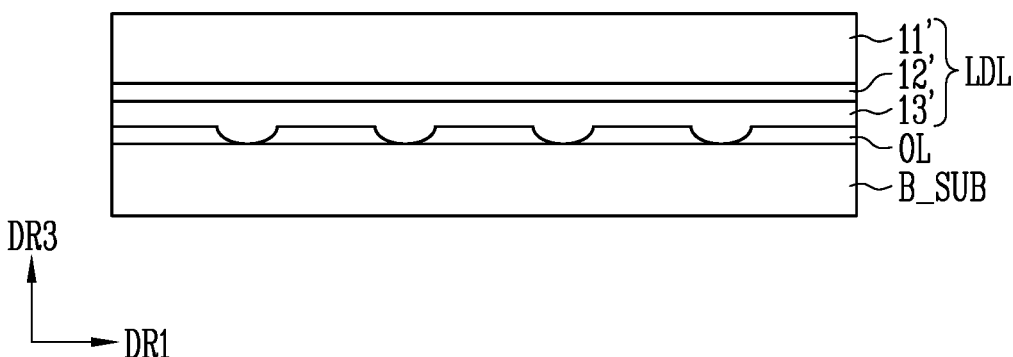

Referring to FIG. 11, the light emitting element layer LDL may be deposited on the base substrate B_SUB on which the organic layer OL is patterned. The light emitting element layer LDL may have a structure in which a layer 13' for forming a second semiconductor layer 13 (e.g., refer to FIG. 12), a layer 12' for forming an active layer 12 (e.g., refer to FIG. 12), and a layer 11' for forming a first semiconductor layer 11 (e.g., refer to FIG. 12) are sequentially stacked.

In an embodiment, the layer 11' for forming the first semiconductor layer 11 (e.g., refer to FIG. 12), the layer 12' for forming the active layer 12 (e.g., refer to FIG. 12), and the layer 13' for forming the second semiconductor layer 13 (e.g., refer to FIG. 12) may be formed by any one of a metal organic chemical vapor-phase deposition (MOCVD) method, a molecular beam epitaxy (MBE) method, a vapor phase epitaxy (VPE) method, and a liquid phase epitaxy (LPE) method.

Figure 12:
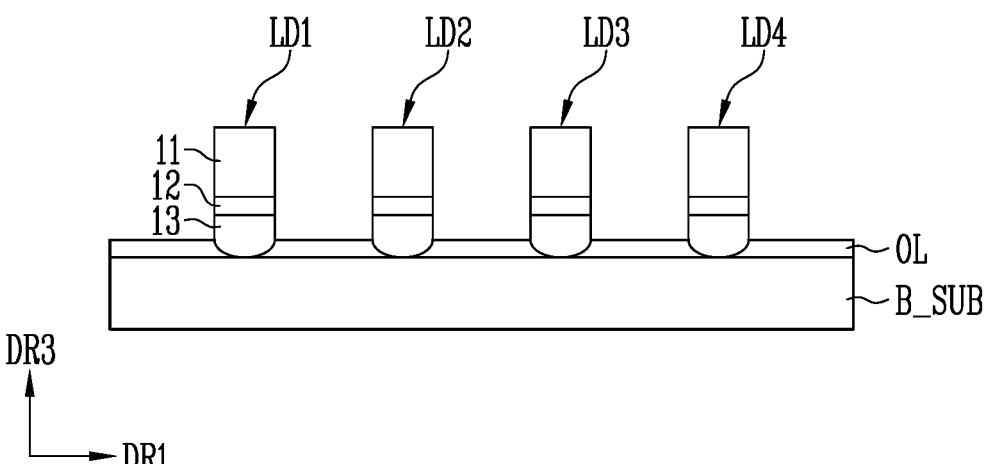

Referring to FIG. 12, the light emitting element layer LDL (e.g., refer to FIG. 11) in the remaining portions except for portions overlapping the grooves GRV in a plan view may be removed to form the light emitting elements LD1 to LD4. In an embodiment, an etching process may be performed on the layer 11' (e.g., refer to FIG. 11) for forming the first semiconductor layer 11, the layer 12' (e.g., refer to FIG. 11) for forming the active layer 12, and the layer 13' for forming the second semiconductor layer 13.

For example, a mask (not shown) may be disposed on the light emitting element layer LDL (e.g., refer to FIG. 11), and the light emitting element layer LDL may be patterned to form nanometer-scale or micrometer-scale gaps through an etching process. The etching process may be performed in a direction from the first semiconductor layer 11 toward the second semiconductor layer 13. Accordingly, first to fourth light emitting elements LD1 to LD4 may be formed.

According to an example, the etching process may be any one of a reactive ion etching (RIE), a reactive ion beam etching (RIBE), and an inductively coupled plasma reactive ion etching (ICP-RIE). However, the disclosure is not limited to specific examples.

Figure 13:
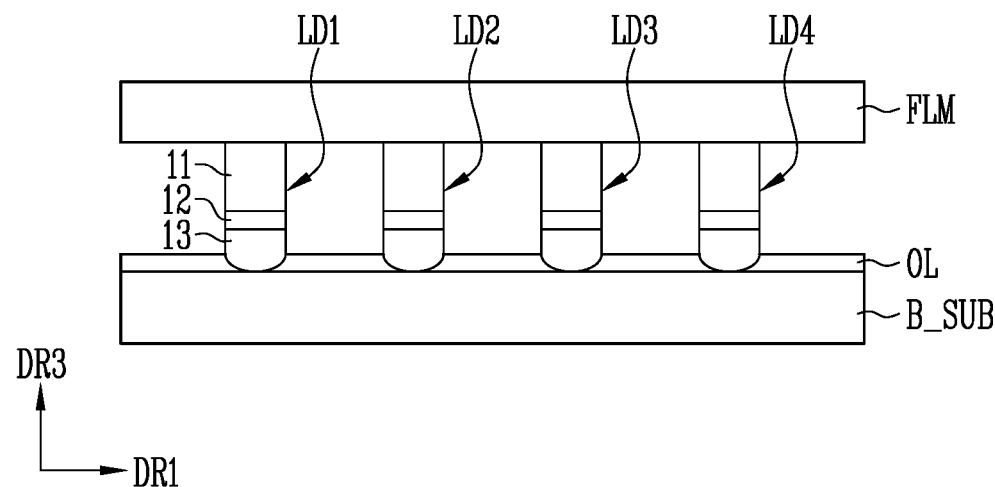

Referring to FIG. 13, the transfer film FLM may be attached to an upper surface (e.g., a second end EP2) of each of the first to fourth light emitting elements LD1 to LD4. The transfer film FLM may be referred to as a donor wafer or a donor substrate. The transfer film FLM may be an isotropic stretchable film. According to an example, the transfer film FLM may be made of at least one of polyolefine, polyvinyl chloride (PVC), elastomeric silicone, elastomeric polyurethane, elastomeric polyisoprene, or the like, but the disclosure is not limited thereto.

In an embodiment, the transfer film FLM may further include an adhesive material attached to the first to fourth light emitting elements LD1 to LD4. The adhesive material of the transfer film FLM may be a material whose adhesive strength changes as ultraviolet (UV) or heat is applied, and thus the transfer film FLM may be configured to be readily separated from the first to fourth light emitting elements LD1 to LD4.

Figure 14:
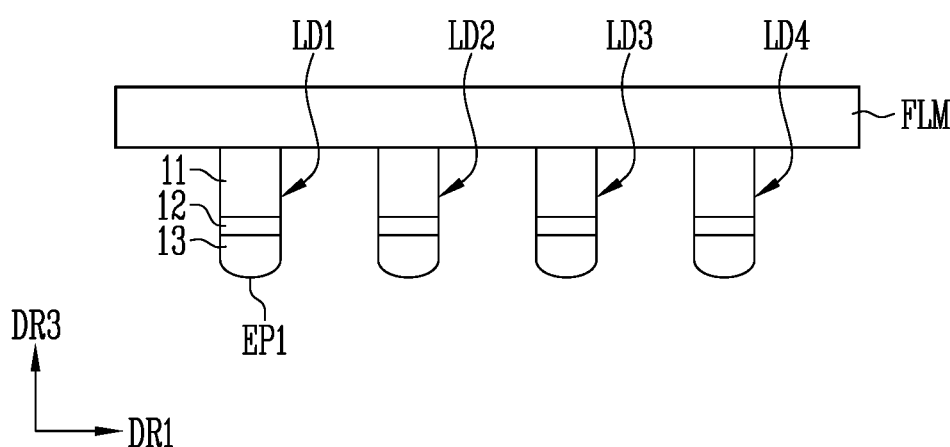

Referring to FIG. 14, the organic layer OL and the base substrate B_SUB may be removed from the first to fourth light emitting elements LD1 to LD4, and the first end EP1 of each of the first to fourth light emitting elements LD1 to LD4 may be exposed. The first end EP1 may have a shape corresponding to a shape of each of the grooves GRV. For example, the first end EP1 may have a rounded shape (or curved surface).

In an embodiment, the base substrate B_SUB may be separated from the light emitting elements LD1 to LD4 by a method such as a laser lift off (LLO) or a chemical lift off (CLO). However, a method of separating a growth substrate 101 is not limited thereto.

Positions of the first to fourth light emitting elements LD1 to LD4 separated from the base substrate B_SUB may be temporarily fixed on the transfer film FLM.

Figure 15:
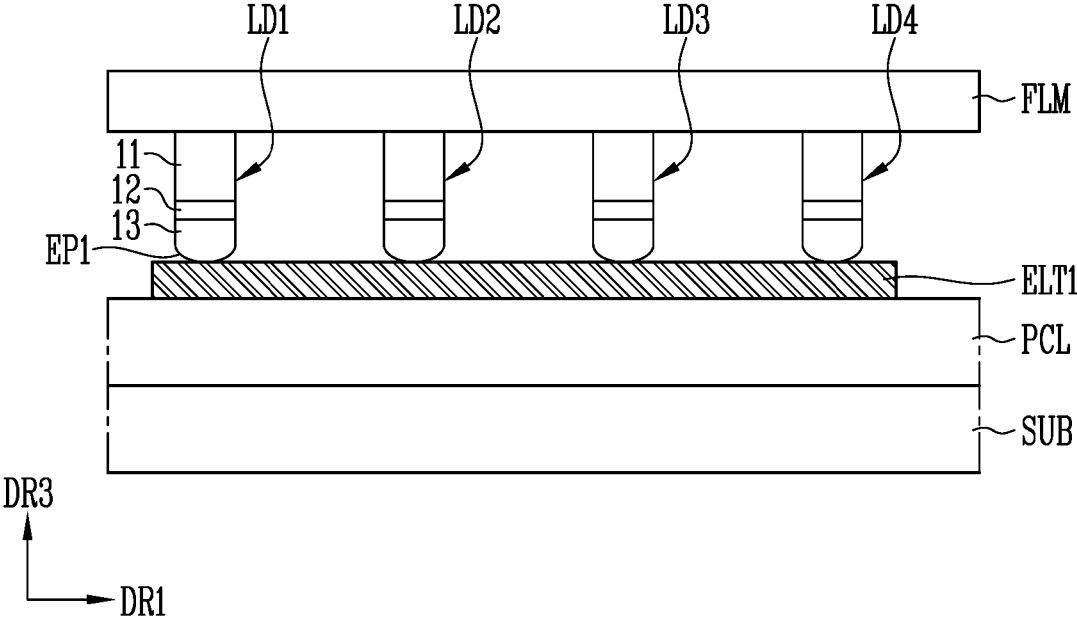

Referring to FIG. 15, the transfer film FLM may be stretched (e.g., stretched to have deformed gaps), and the first to fourth light emitting elements LD1 to LD4 with deformed gaps (e.g., gaps formed by stretching transfer film FLM) may be bonded to the first electrode ELT1.

The transfer film FLM may be stretched (or extended) in two dimensions with respect to a direction perpendicular to the third direction DR3. As the transfer film FLM is stretched, the gaps between the first to fourth light emitting elements LD1 to LD4 may be increased.

The pixel circuit layer PCL and the first electrode ELT1 disposed on the pixel circuit layer PCL may be prepared through a separate manufacturing process.

The first to fourth light emitting elements LD1 to LD4 may be bonded to the first electrode ELT1. For example, in case that a laser is irradiated to the first to fourth light emitting elements LD1 to LD4 and the first electrode ELT1, an intermetallic compound may be generated and grown between the first to fourth light emitting elements LD1 to LD4 and the first electrode ELT1. The first to fourth light emitting elements LD1 to LD4 and the first electrode ELT1 may be electrically connected to each other by the intermetallic compound. However, the bonding method is not limited thereto. For example, as the bonding method, an anisotropic conductive film (AFC) bonding method, an ultrasonic bonding method, a ball grid array (BGA) method, a thermo compression (TC) bonding method, or the like may be used.

Figure 16:
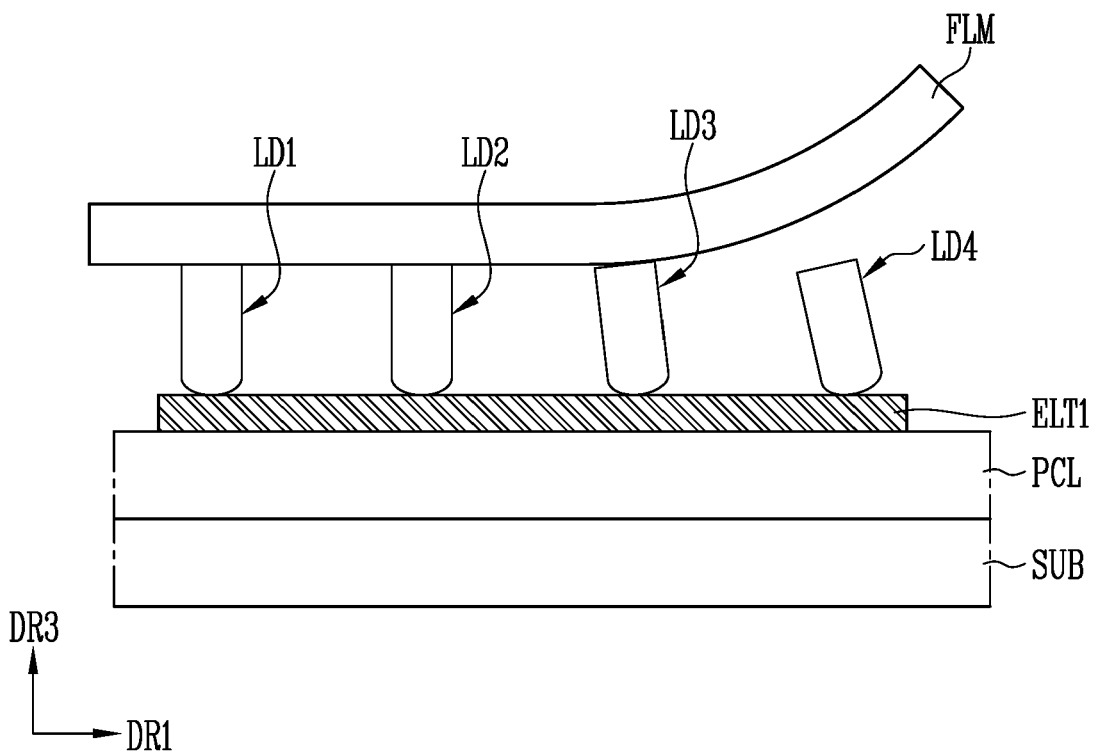

Referring to FIG. 16, the transfer film FLM may be separated from the first to fourth light emitting elements LD1 to LD4. In an embodiment, a laser may be irradiated to the transfer film FLM and/or heat may be applied to the transfer film FLM to weaken the adhesive force between the transfer film FLM and the first to fourth light emitting elements LD1 to LD4. Thus, the transfer film FLM may be separated from the first to fourth light emitting elements LD1 to LD4. The transfer film FLM may be removed from the first to fourth light emitting elements LD1 to LD4 by various methods.

However, in a process of separating the transfer film FLM, the light emitting element (e.g., LD1 to LD4) may be collapsed or inclined with respect to the third direction DR3 due to the bonding force remaining between the transfer film FLM and the light emitting element (e.g., LD1 to LD4). For example, among the first to fourth light emitting elements LD1 to LD4, the first and second light emitting elements LD1 and LD2 may be maintained in a vertically arranged state, but the third and fourth light emitting elements LD3 and LD4 may be inclined with respect to the third direction DR3.

Since the first end EP1 includes the curved surface, although the light emitting element LD is collapsed or inclined during a process of removing the transfer film FLM, contact and conduction between the first end EP1 and the first electrode ELT1 may be maintained. Accordingly, the number of effective light emitting elements capable of being driven and emitting light may be increased, and the yield of the display device may be improved.

Figure 17:
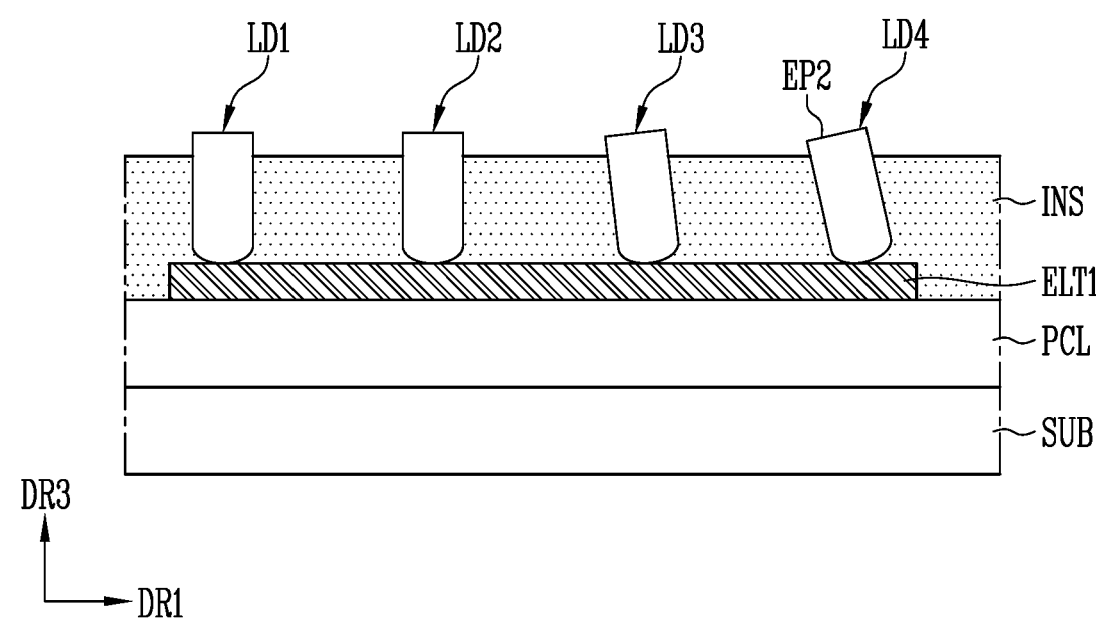

Referring to FIG. 17, the insulating layer INS may be formed on the first electrode ELT1. The insulating layer INS may cover the exposed first electrode ELT1. The insulating layer INS may fill the gaps between the first to fourth light emitting elements LD1 to LD4.

In an embodiment, the insulating layer INS may be formed through a process of depositing an organic material or an inorganic material. A portion of the insulating layer INS may be removed by etching or the like, so that the second end EP2 of each of the first to fourth light emitting elements LD1 to LD4 may be exposed to outside thereof. The second end EP2 of each of the third and fourth light emitting elements LD3 and LD4 may have an inclined surface with respect to the first direction DR1.

Figure 18:
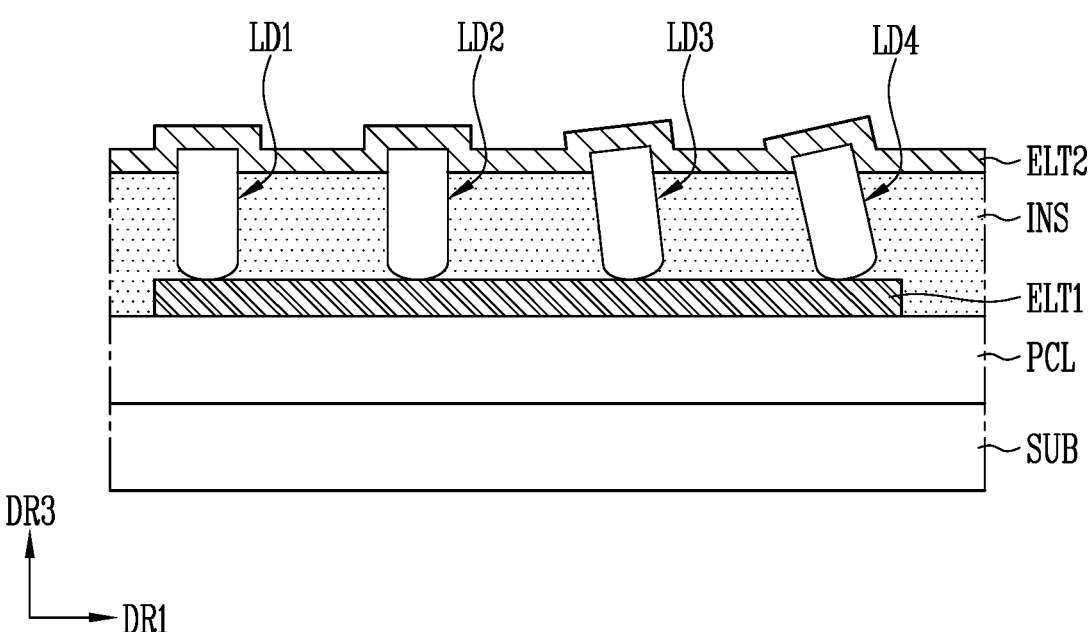

Referring to FIG. 18, the second electrode ELT2 may be formed (e.g., entirely formed) on the exposed surfaces (e.g., the second end EP2 and the insulating layer INS) of the first to fourth light emitting elements LD1 to LD4. The second electrode ELT2 may be in contact with and electrically connected to the second end EP2 of each of the first to fourth light emitting elements LD1 to LD4.

The second electrode ELT2 may be formed to have a very thin thickness, and may be formed along the shape of the interface of the second end EP2. For example, an upper surface of the second electrode ELT2 corresponding to the third and fourth light emitting elements LD3 and LD4 may include an inclined surface with respect to the first direction DR1.

The display element layer DPL of FIG. 5 may be formed by the above-described processes.

Figure 19:
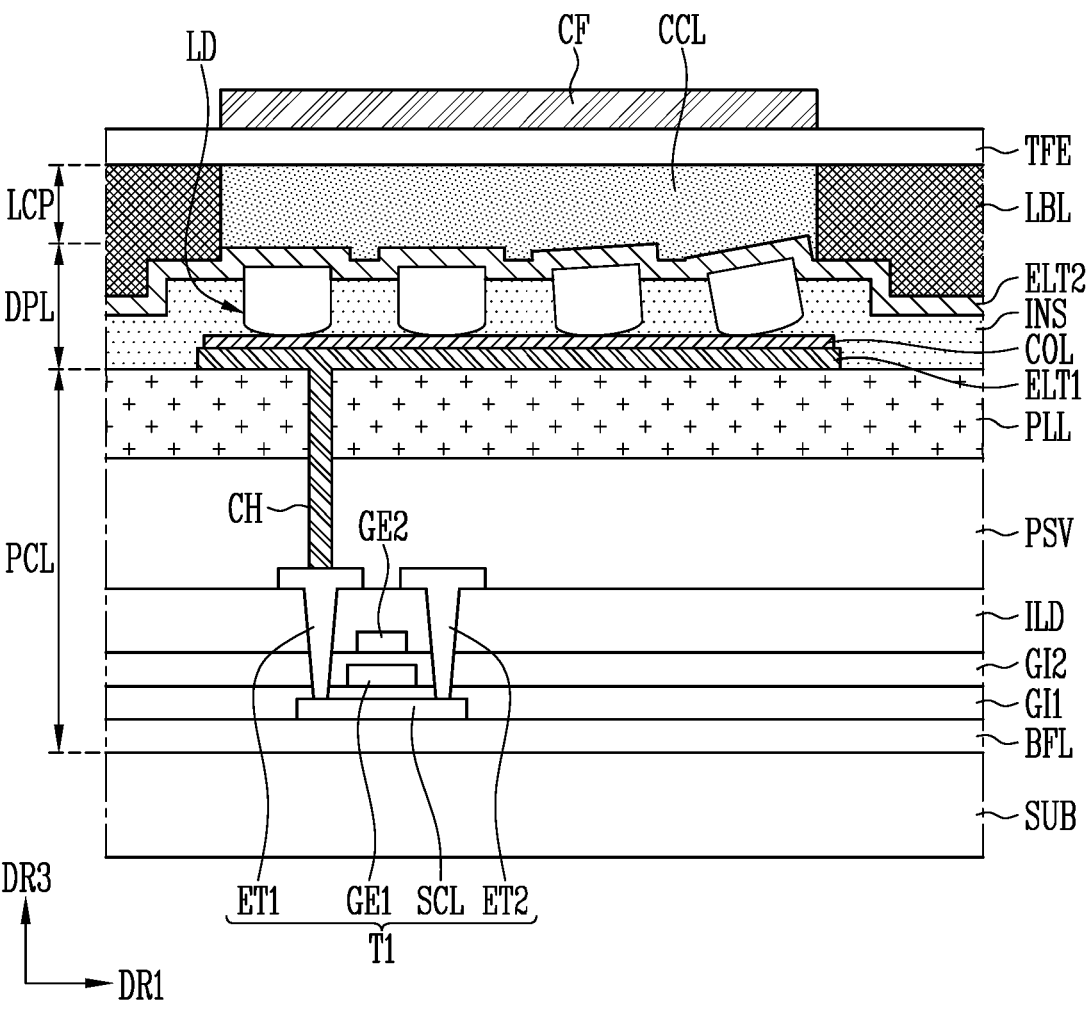
FIG. 19 is a schematic cross-sectional view illustrating an example of the display device of FIG. 2.

FIG. 19 is a schematic cross-sectional view illustrating an example of the display device of FIG. 2.

In FIG. 19, the same reference numerals are used for the components described with reference to FIG. 5. Thus, repetitive description of the same constituent components is omitted. A display device of FIG. 19 may have a configuration different from that of the display device of FIG. 5 at least in a connection electrode COL.

Referring to FIGS. 2, 7, and 19, a display device DD may include a substrate SUB, a pixel circuit layer PCL, a display element layer DPL, and a light control layer LCP. The display device DD may further include an encapsulation layer TFE.

In an embodiment, the display element layer DPL may include a first electrode ELT1, the connection electrode COL, a light emitting element LD, an insulating layer INS, and a second electrode ELT2.

The connection electrode COL may be disposed on the first electrode ELT1. The connection electrode COL may include a conductive material to electrically connect the first electrode ELT1 and the light emitting element LD. The connection electrode COL may be in contact (e.g., direct contact) with a first end EP1 of the light emitting element LD.

According to an embodiment, the connection electrode COL may include a reflective conductive material to reflect light emitted from the light emitting element LD to improve luminous efficiency of a pixel PXL.

In an embodiment, the connection electrode COL may be (or include) a bonding metal that may be bonded (or coupled) to the light emitting element LD. The connection electrode COL may be bonded (or coupled) to the light emitting element LD.

As described above, according to the display device and the method of manufacturing the same according to the embodiments of the disclosure, the first end EP1 of the light emitting element LD may include the curved surface in the form of a round convex toward outside of the light emitting element LD. Accordingly, even if the light emitting element LD is collapsed or inclined during the process of removing the transfer film FLM, contact and conduction between the first end EP1 and the first electrode ELT1 may be maintained. Also, since the first end EP1 has a gentle curved shape, an average contact area between the first end EP1 of the light emitting elements LD and the first electrode ELT1 may be secured to the maximum. Accordingly, the number of effective light emitting elements capable of being driven and emitting light may be increased, and the yield of the display device may be improved.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a pixel circuit layer disposed on a substrate;
a first electrode disposed on the pixel circuit layer;
light emitting elements provided on the first electrode and electrically connected to the first electrode;
a second electrode provided on the light emitting elements; and
an insulating layer filling gaps between the light emitting elements between the first electrode and the second electrode, wherein
each of the light emitting elements includes an insulating film, a first end, and a second end, the first end and the second end exposed by the insulating film,
the second end is opposite the first end,
a majority of the second end is in contact with the second electrode, and an entirety of the first end is a curved surface.

2. The display device of claim 1, wherein
the first end corresponds to a lower end of a corresponding one of the light emitting elements, and
the second end corresponds to an upper end of the corresponding one of the light emitting elements.

3. The display device of claim 2, wherein the first end of each of the light emitting elements includes the curved surface in a form of a round convex toward an outside.

4. The display device of claim 3, wherein at least part of the light emitting elements are disposed to be inclined with respect to a vertical direction.

5. The display device of claim 4, wherein the second end of each of the at least part of the light emitting elements inclined with respect to the vertical direction has an inclined surface with respect to a plane parallel to the substrate.

6. The display device of claim 3, wherein the first end of each of the light emitting elements directly contacts the first electrode.

7. The display device of claim 3, wherein each of the light emitting elements further comprises:
a first semiconductor layer electrically connected to the second electrode;
a second semiconductor layer electrically contacting the first electrode; and
an active layer disposed between the first semiconductor layer and the second semiconductor layer.

8. The display device of claim 7, wherein the second semiconductor layer includes the curved surface corresponding to the first end.

9. The display device of claim 8, wherein each of the light emitting elements further comprises:
a reflective member surrounding an outer surface of the insulating film.

10. The display device of claim 3, further comprising:
a light control layer provided on the second electrode and controlling a wavelength of light emitted from the light emitting elements; and
a thin film encapsulation layer provided on the light control layer.

11. A method of manufacturing the display device of claim 1, the method comprising:
forming grooves on a base substrate;
depositing a light emitting element layer on the base substrate;
removing remaining portions of the light emitting element layer except for portions overlapping the grooves in a plan view to form the light emitting elements;
attaching a transfer film to upper surfaces of the light emitting elements;

removing the base substrate to expose the first end of each of the light emitting elements;
bonding the first end of each of the light emitting elements to the first electrode formed on the pixel circuit layer;
separating the transfer film from the light emitting elements;
forming the insulating layer on the first electrode to fill gaps between the light emitting elements; and
forming the second electrode on the light emitting elements and the insulating layer.

12. The method of claim 11, wherein the curved surface of the first end corresponds to a shape of each of the grooves.

13. The method of claim 11, wherein the forming of the grooves on the base substrate comprises:
forming an organic film on the base substrate; and
patterning the organic film to form the grooves to expose at least a portion of the base substrate.

14. The method of claim 11, wherein the bonding of the first end of each of the light emitting elements to the first electrode comprises:
stretching the transfer film; and
bonding the first end of each of the light emitting elements with deformed gaps to the first electrode.

15. The method of claim 11, wherein
the first end corresponds to a lower end of a corresponding one of the light emitting elements, and
a second end corresponds to an upper end of the corresponding one of the light emitting elements.

16. The method of claim 15, wherein the first end of each of the light emitting elements includes the curved surface in a form of a round convex toward an outside.

17. The method of claim 16, wherein at least part of the light emitting elements are disposed to be inclined with respect to a vertical direction.

18. The method of claim 17, wherein the second end of each of the at least part of the light emitting elements inclined with respect to the vertical direction has an inclined surface with respect to a plane parallel to a substrate of the display device.

19. A display device comprising:
a pixel circuit layer disposed on a substrate;
a first electrode disposed on the pixel circuit layer;
light emitting elements provided on the first electrode and electrically connected to the first electrode;
a second electrode provided on the light emitting elements; and
an insulating layer filling gaps between the light emitting elements between the first electrode and the second electrode, wherein
each of the light emitting elements includes a first end and a second end,
the first end includes a curved surface,
the first end corresponds to a lower end of a corresponding one of the light emitting elements,
the second end corresponds to an upper end of the corresponding one of the light emitting elements,
the first end of each of the light emitting elements includes the curved surface in a form of a round convex toward an outside,
each of the light emitting elements comprises:
a first semiconductor layer electrically connected to the second electrode;
a second semiconductor layer electrically contacting the first electrode;
an active layer disposed between the first semiconductor layer and the second semiconductor layer, an insulating film surrounding an outer surface of each of the first semiconductor layer, the active layer, and the second semiconductor layer; and a reflective member surrounding an outer surface of the insulating film, the second semiconductor layer includes the curved surface corresponding to the first end, and the reflective member partially surrounds the outer surface of the insulating film so that a portion of the insulating film is exposed to the outside.

20. A display device comprising:

a pixel circuit layer disposed on a substrate;

a first electrode disposed on the pixel circuit layer;

a light emitting element provided on the first electrode and electrically connected to the first electrode;

a second electrode provided on the light emitting element; and an insulating layer contacting a side surface of the light emitting element between the first electrode and the second electrode, wherein the light emitting element includes an insulating film, a first end, and a second end, the first end and the second end exposed by the insulating film, the second end is opposite the first end, a majority of the second end is in contact with the second electrode, the first end faces the first electrode, and an entirety of the first end is a curved surface.

21. The display device of claim 20, wherein the first end of the light emitting element includes the curved surface in a form of a round convex toward an outside, and the second end is a flat surface that is inclined with respect to a horizontal direction.

22. A light emitting element comprising:

a first semiconductor layer;

a second semiconductor layer;

an active layer disposed between the first semiconductor layer and the second semiconductor layer;

an insulating film surrounding an outer surface of each of the first semiconductor layer, the active layer, and the second semiconductor layer; and a reflective member surrounding an outer surface of the insulating film, wherein an exposed end of the second semiconductor layer includes a curved surface in a form of a round convex toward an outside.

* * * * *